United States Patent
Jang

(10) Patent No.: US 10,156,663 B2
(45) Date of Patent: Dec. 18, 2018

(54) DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Sung Ki Jang, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 65 days.

(21) Appl. No.: 14/643,366

(22) Filed: Mar. 10, 2015

(65) Prior Publication Data

US 2016/0124127 A1 May 5, 2016

(30) Foreign Application Priority Data

Oct. 30, 2014 (KR) .................... 10-2014-0149378

(51) Int. Cl.
| | |
|---|---|
| *G02F 1/1335* | (2006.01) |
| *G02B 5/00* | (2006.01) |
| *G02F 1/1333* | (2006.01) |
| *H01L 51/52* | (2006.01) |
| *H01L 51/56* | (2006.01) |
| *H01L 27/32* | (2006.01) |

(52) U.S. Cl.
CPC ....... *G02B 5/005* (2013.01); *G02F 1/133308* (2013.01); *H01L 51/524* (2013.01); *G02F 2001/133331* (2013.01); *H01L 27/3272* (2013.01); *H01L 51/5284* (2013.01); *H01L 51/56* (2013.01)

(58) Field of Classification Search
CPC ............... G06F 3/0488; G06F 3/04886; G02F 1/133308; G02F 1/133608; G02F 1/133512; G02F 1/13338

USPC ......................... 345/173; 349/58, 106; 257/40
See application file for complete search history.

(56) References Cited

U.S. PATENT DOCUMENTS

| | | | |
|---|---|---|---|
| 5,361,695 A * | 11/1994 | Takagi ................ | B41F 15/36 101/127 |
| 7,884,900 B2 * | 2/2011 | Doi ................. | G02F 1/133512 349/106 |
| 8,520,154 B2 * | 8/2013 | Wu .................. | G02F 1/13338 345/173 |
| 9,417,722 B2 * | 8/2016 | Lin ..................... | G06F 3/041 |
| 2012/0075838 A1 * | 3/2012 | Lee .................. | G02F 1/133308 362/97.1 |

(Continued)

FOREIGN PATENT DOCUMENTS

| KR | 10-2006-0114076 A | 11/2006 |
|---|---|---|
| KR | 10-2008-0034547 A | 4/2008 |

(Continued)

*Primary Examiner* — Audrey Y Chang
(74) *Attorney, Agent, or Firm* — Lee & Morse, P.C.

(57) ABSTRACT

Provided is a display device including a display panel; and a window facing the display panel, a display area and a non-display area, which is around the display area, being on the window and the window including a transparent substrate, which has a first surface facing the display panel and a second surface opposite to the first surface, a bank layer, which is on the first surface of the transparent substrate along boundaries between the display area and the non-display area, and a printed pattern, which is in the non-display area of the transparent substrate and is located closer to an outer side of the window than is the bank layer.

12 Claims, 9 Drawing Sheets

(56) References Cited

U.S. PATENT DOCUMENTS

| | | | | |
|---|---|---|---|---|
| 2013/0082961 A1* | 4/2013 | Wang | ................... | G06F 3/044 |
| | | | | 345/173 |
| 2013/0153393 A1 | 6/2013 | Omote et al. | | |
| 2014/0070174 A1* | 3/2014 | Kwon | ................... | H01L 51/50 |
| | | | | 257/40 |
| 2014/0153100 A1* | 6/2014 | Yi | ................... | G02B 5/223 |
| | | | | 359/609 |

FOREIGN PATENT DOCUMENTS

| KR | 10-2013-0028801 A | 3/2013 |
|---|---|---|
| KR | 10-2014-0062962 A | 5/2014 |

\* cited by examiner

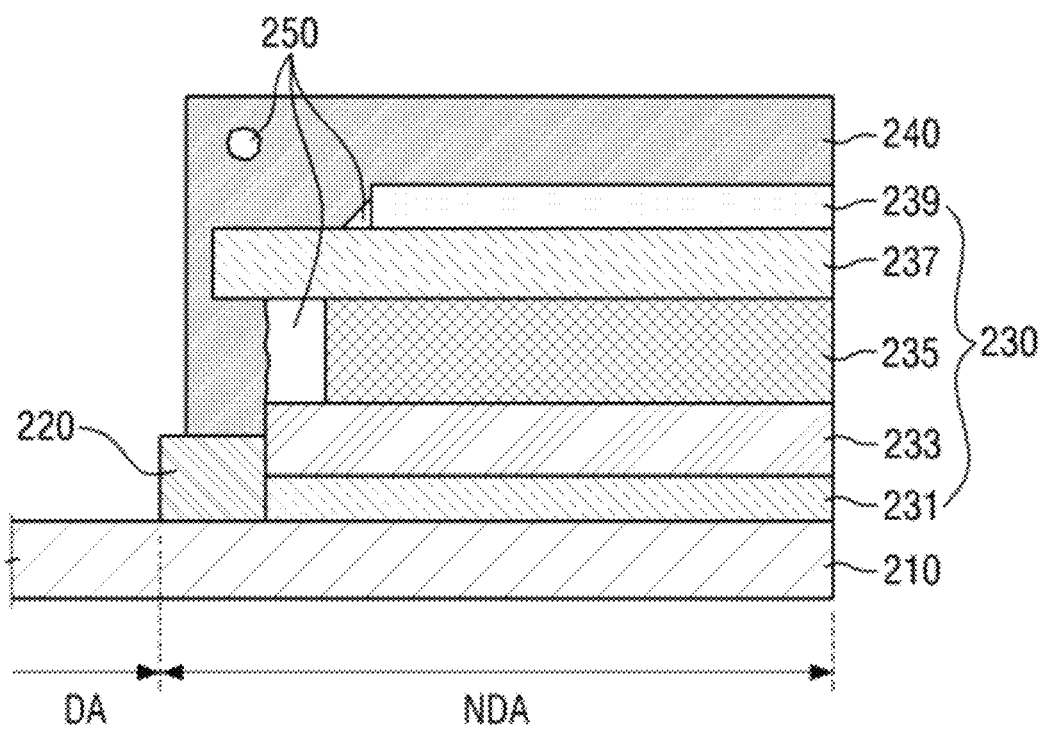

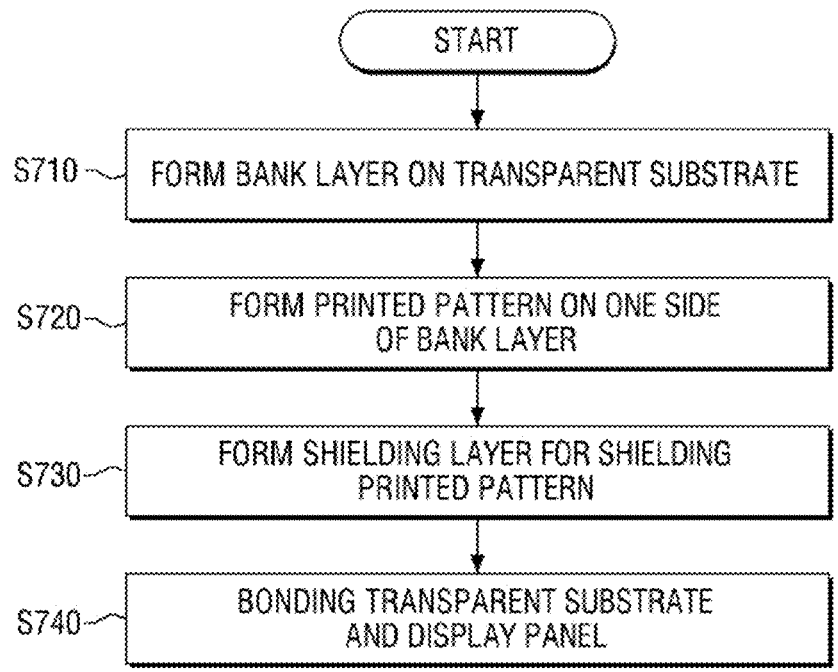
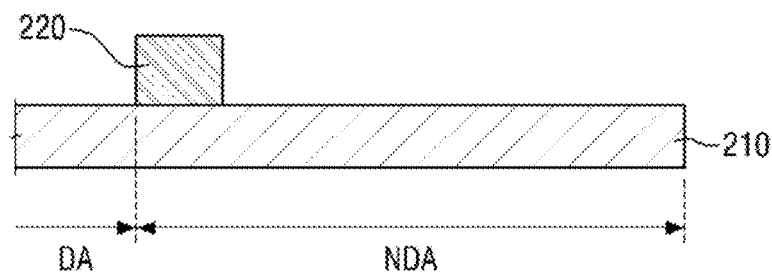

DISPLAY DEVICE AND METHOD OF MANUFACTURING THE SAME

CROSS-REFERENCE TO RELATED APPLICATION

Korean Patent Application No. 10-2014-0149378, filed on Oct. 30, 2014, in the Korean Intellectual Property Office, and entitled: "Display Device and Method of Manufacturing the Same," is incorporated by reference herein in its entirety.

BACKGROUND

1. Field

Provided is a display device and a method of manufacturing the same.

2. Description of the Related Art

Screen printing may involve moving a squeegee to fill ink in a mesh opening of a screen mask with the use of the tension applied to the mesh opening, and transferring the ink to a substrate by separating the screen mask and the substrate, which linearly contact each other. Screen printing is a method of applying ink onto a substrate that may use variations in the viscoelasticity of ink.

SUMMARY

Embodiments may be realized by providing a display device, including a display panel; and a window facing the display panel, a display area and a non-display area, which is around the display area, being on the window and the window including a transparent substrate, which has a first surface facing the display panel and a second surface opposite to the first surface, a bank layer, which is on the first surface of the transparent substrate along boundaries between the display area and the non-display area, and a printed pattern, which is in the non-display area of the transparent substrate and is located closer to an outer side of the window than is the bank layer.

The bank layer may be in the shape of a band.

The printed pattern may include a plurality of printed layers.

Each of the printed layers may be located closer to the outer side of the window than is an inner side of the bank layer.

The printed layers may include a printed layer with a first width and a printed layer with a second width.

The printed layers may include a printed layer with a first thickness and a printed layer with a second thickness.

The printed layers may include a first printed layer, which is directly on the transparent substrate and contacts an inner side of the bank layer on one side thereof.

The printed layers may include a printed layer with a first color and a printed layer with a second color.

The printed layers may be in a stepwise pattern.

The window may further include a shielding layer, which covers the printed pattern and shields the printed pattern.

The shielding layer may contact a top surface of the bank layer.

The shielding layer may be located closer to the outer side of the window than is an inner side of the bank layer.

The shielding layer may include air pockets between the shielding layer and the printed pattern or between the shielding layer and the bank layer.

The display device may further include a bonding layer bonding the display panel and the window together.

Embodiments may be realized by providing a method of manufacturing a display device, the method including forming a bank layer on a first surface of a transparent substrate along boundaries between a display area and a non-display area, which are predefined on the transparent substrate; forming a printed pattern on the first surface of the transparent substrate such that the printed pattern is located closer to an outer side of the transparent substrate than is the bank layer; and bonding the transparent substrate and a display panel such that the first surface of the transparent substrate faces the display panel.

Forming the bank layer may include forming the bank layer in the shape of a band.

Forming the printed pattern may include placing a screen mask with a predetermined opening on the transparent substrate where the bank layer is formed; applying ink of a predetermined color onto the screen mask by using a squeegee; and removing the screen mask.

Forming the printed pattern may further include curing the ink applied onto the transparent substrate.

Forming the printed pattern may include forming a plurality of printed layers by repeatedly placing the screen mask on the transparent substrate, applying ink onto the screen mask, and removing the screen mask.

The method may further include forming a shielding layer for shielding the printed pattern.

BRIEF DESCRIPTION OF THE DRAWINGS

Features will become apparent to those of skill in the art by describing in detail exemplary embodiments with reference to the attached drawings in which:

FIGS. 3 to 6 illustrate cross-sectional views taken along lines III-III' of FIG. 1;

FIG. 7 illustrates a flowchart of a method of manufacturing a display device, according to an exemplary embodiment; and FIGS. 8 through 14 illustrate cross-sectional views of processes of the method of manufacturing a display device, according to an exemplary embodiment.

DETAILED DESCRIPTION

Figure 1:
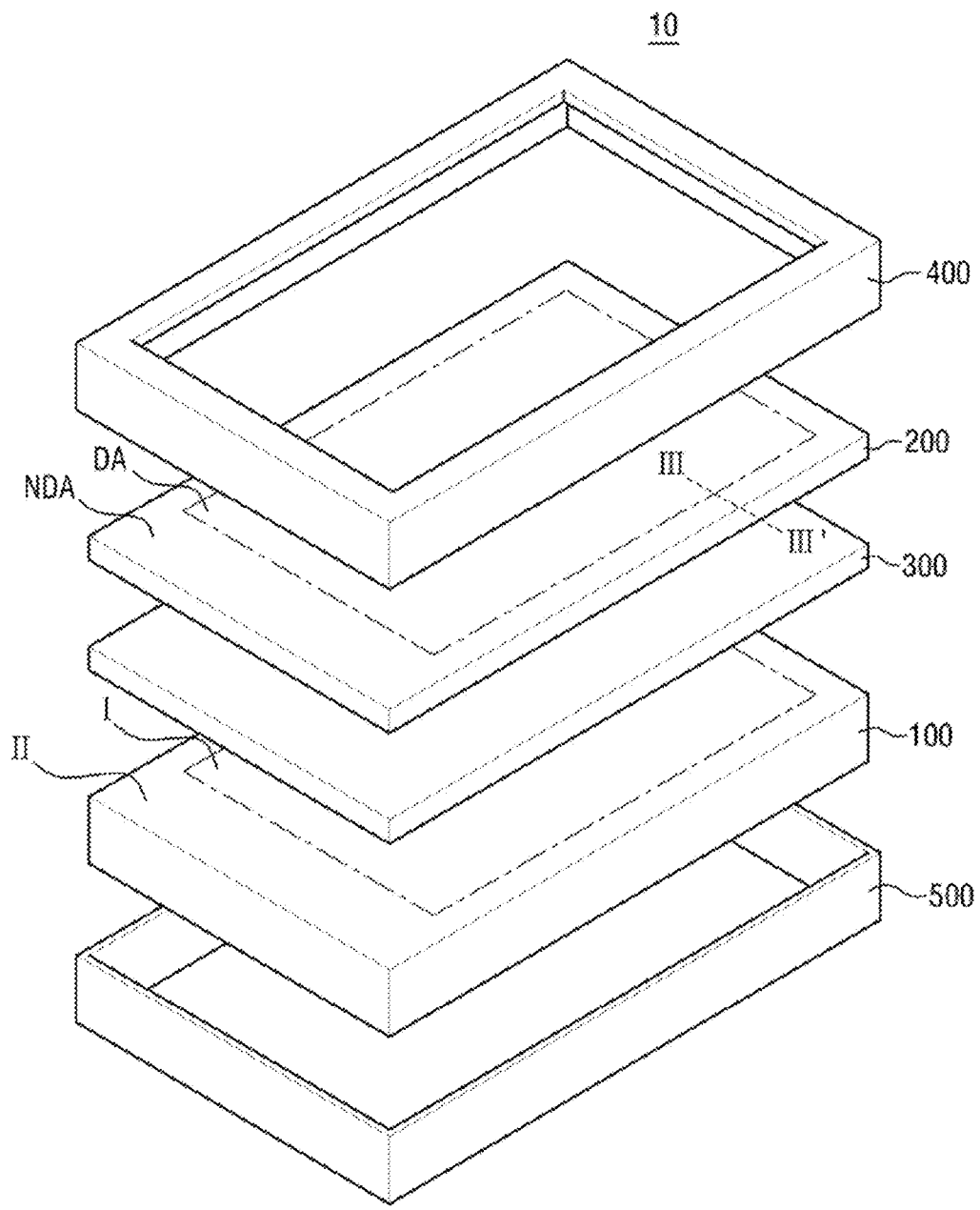
FIG. 1 illustrates an exploded perspective view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views, and/or cross-sectional views by way of ideal schematic views. Accordingly, the exemplary views may be modified depending on manufacturing technologies and/or tolerances. Therefore, the embodiments are not limited to those shown in the views, but include modifications in configuration formed on the basis of manufacturing processes. Therefore, regions exemplified in figures have schematic properties and shapes of regions shown in figures exemplify specific shapes of regions of elements and are not intended to be limiting.

Exemplary embodiments will hereinafter be described with reference to the accompanying drawings.

FIG. 1 illustrates an exploded perspective view of a display device according to an exemplary embodiment.

Referring to FIG. 1, a display device 10 may include a display panel 100 and a window 200, which may face the display panel 100.

The display panel 100, which may be a panel for displaying an image, may be a liquid crystal display (LCD) panel, an electrophoretic display (EPD) panel, an organic light-emitting diode (OLED) panel, a light-emitting diode (LED) panel, an inorganic electroluminescent (EL) display panel, a field emission display (FED) panel, a surface-conduction electron-emitter display (SED) panel, a plasma display panel (PDP), or a cathode ray tube (CRT) display panel.

The display panel 100 may include a display portion I and a non-display portion II, which may be disposed around the display portion I. An outermost black matrix may be arranged in the non-display portion II, which may be provided around the display portion I, along the sides of the display portion I.

The boundaries between the display portion I and the non-display portion II may form a rectangular shape, as illustrated in FIG. 1. In an embodiment, the boundaries between the display portion I and the non-display portion II may form various shapes other than a rectangular shape, such as a circular or polygonal shape, depending on the shape of the display panel 100.

The window 200 may face a light-emitting direction of the display panel 100, and may be bonded to the display panel 100. In an exemplary embodiment, the window 200 and the display panel 100 may be bonded together by a bonding layer 300, which may be interposed between the window 200 and the display panel 100. The bonding layer 300 may be formed of, for example, an optical clear adhesive (OCA) or an optical clear resin (OCR). The OCA or OCR may be formed on the entire surface of the window 130, and may bond the window 130 to the display panel 100.

The window 200 may be used as the substrate of a touch screen panel (TSP). Electrodes for sensing the location of a touch input made in response to an object, for example, a hand or a touch stick, being placed in contact with the TSP may be disposed on the window 200, and the electrodes may be formed of a transparent material. In an embodiment, the TSP may include an additional transparent substrate and touch electrodes disposed on the transparent substrate, in which case, the TSP may be disposed between the display panel 100 and the window 200.

A display area DA and a non-display area NDA, which may be disposed around the display area DA, may be defined on the window 200. The display area DA may include an area in which an image is displayed through the display portion I of the display panel 100 and which may be visible from the outside of the display device 10 through the window 200. The non-display area NDA may include an area in which no image is displayed and which may not be visible from the outside of the display device 10 through the window 200. The window 200 will be described later in further detail.

The display device 10 may also include an upper case 400 and a lower case 500. The upper case 400 may be disposed above the window 200 and the display panel 100. The upper case 400 may form the top exterior and the side exterior of the display device 10. The upper case 400 may include an opening through which the display panel 100 is exposed to an upper side of the display device 10. The display area DA of the window 200 may be exposed to the outside of the display device 10 via the opening of the upper case 400.

The lower case 500 may form the bottom exterior of the display device 10. All the elements of the display device 10, except for the upper case 400, may be accommodated in the lower case 500. The lower case 500 may include a bottom surface and a plurality of sides extended upwardly from the edges of the bottom surface. The sides of the lower case 500 may be disposed, for example, more inwardly than the sides of the upper case 400.

Figure 2:
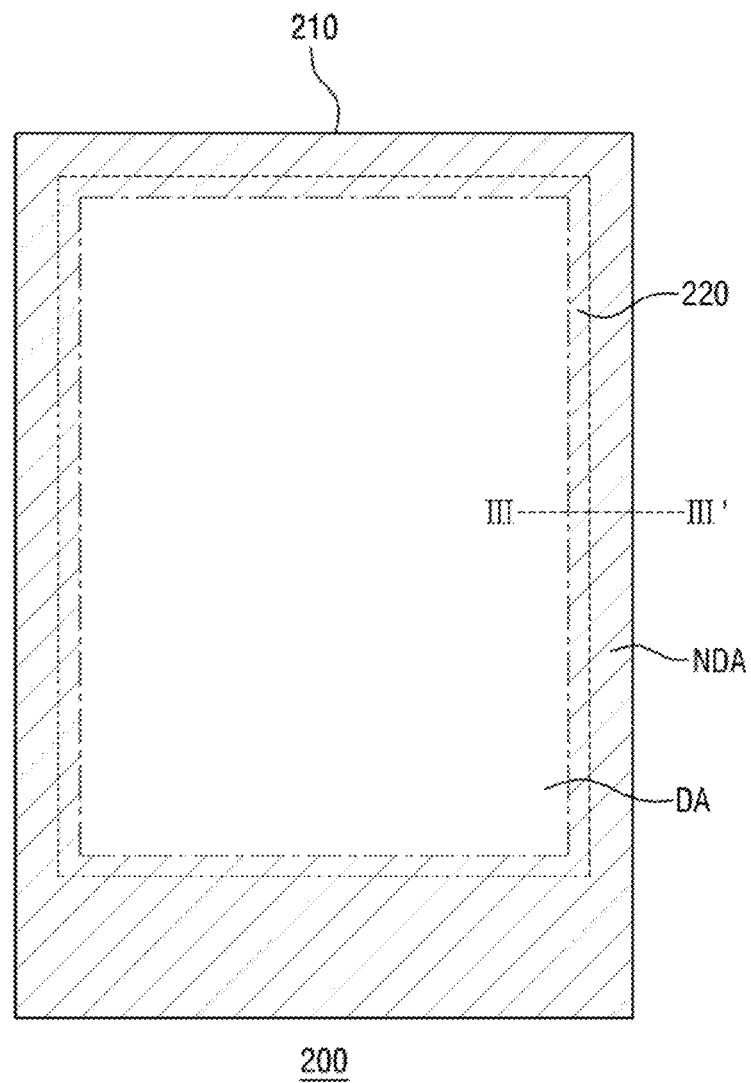
FIG. 2 illustrates a bottom view of the display device according to an exemplary embodiment.

The window 200 will hereinafter be described in further detail. FIG. 2 illustrates a bottom view of the display device according to an exemplary embodiment, and FIG. 3 illustrates a cross-sectional view taken along line of FIG. 1.

Figure 3:
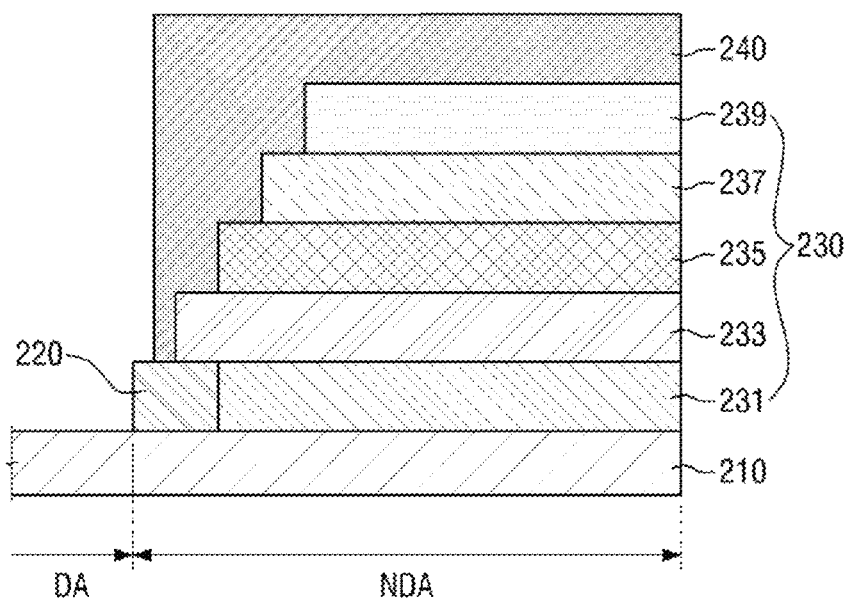

Referring to FIGS. 1 to 3, the window 200 may include a transparent substrate 210 and a bank layer 220, a printed pattern 230 and a shielding layer 240, which may be disposed on the transparent substrate 210.

The transparent substrate 210 may be formed of a transparent material. In an exemplary embodiment, the transparent substrate 210 may be formed of glass, acrylic, polycarbonate, sapphire, quartz, a transparent plastic material, or a combination thereof. The transparent substrate 210 may have, for example, a cuboidal shape. In an embodiment, the transparent substrate 210 may be formed in various shapes, other than a cuboidal shape, depending on the shape of the display panel 100.

The transparent substrate 210 may include an inner surface, which may face the display panel 100, and an outer surface, which may be opposite to the inner surface. The bank layer 220, the printed pattern 230 and the shielding layer 240 may be disposed on the inner surface of the transparent substrate 210, i.e., a surface of the transparent substrate 210 that faces the display panel 100. The bank layer 220 may be formed in the non-display area NDA on the transparent substrate 210, and may be disposed near the boundaries between the non-display area NDA and the display area DA. The bank layer 220 may define a standard for determining an inner side of the non-display area NDA. The bank layer 220 may be formed in the shape of a band with a predetermined width and thickness. The bank layer 220 is illustrated in FIG. 2 as being formed in the shape of a rectangular band.

The printed pattern 230 may be disposed in the non-display area NDA of the window 200, and may be located relatively nearer than the bank layer 220 to an outer side of the window 200, i.e., closer to an outer side of the window 200 than is the bank layer 220. The printed pattern 230 may prevent light from leaking out of the display device 10, and may apply a color to the bezel of the display device 10.

The printed pattern 230 may be implemented as a printed layer stack. For example, the printed pattern 230 may include a stack of a plurality of first, second, third, fourth and fifth printed layers 231, 233, 235, 237, and 239. The printed pattern 230 is illustrated in FIG. 3 as including, for example, a stack of five printed layers.

The first printed layer 231 may be disposed directly on the transparent substrate 210. One end of the first printed layer 231 may be placed in contact with an inner sidewall of the bank layer 220.

The second printed layer 233 may be disposed directly on the first printed layer 231. One end of the second printed layer 233 may be located on the top surface of the bank layer 220. The third printed layer 235 may be disposed directly on the second printed layer 233, the fourth printed layer 237 may be disposed directly on the third printed layer 235, and the fifth printed layer 239 may be disposed directly on the fourth printed layer 237.

The first, second, third, fourth and fifth printed layers 231, 233, 235, 237, and 239 may have the same thickness, and the width of the printed pattern 230 may decrease from the first printed layer 231 to the second printed layer 233 to the third printed layer 235 to the fourth printed layer 237 to the fifth printed layer 239. As a result, the printed pattern 230 may be configured to have a stepped portion formed on one side thereof.

The shielding layer 240 may be disposed to cover the printed pattern 230. The shielding layer 240 may contact the top surface of the bank layer 220. For an effective display, an inner side of the bank layer 220 may be located nearer than an inner side of the bank layer 220 to the outer side of the window 200. The shielding layer 240 may prevent the printed pattern 230, which may be formed to more than a predetermined height, from being exposed to the outside of the window 200. The shielding layer 240 may be formed in a dark color such as black in order to effectively prevent the printed pattern 230 from being visible from the outside of the window 200.

Figure 4:
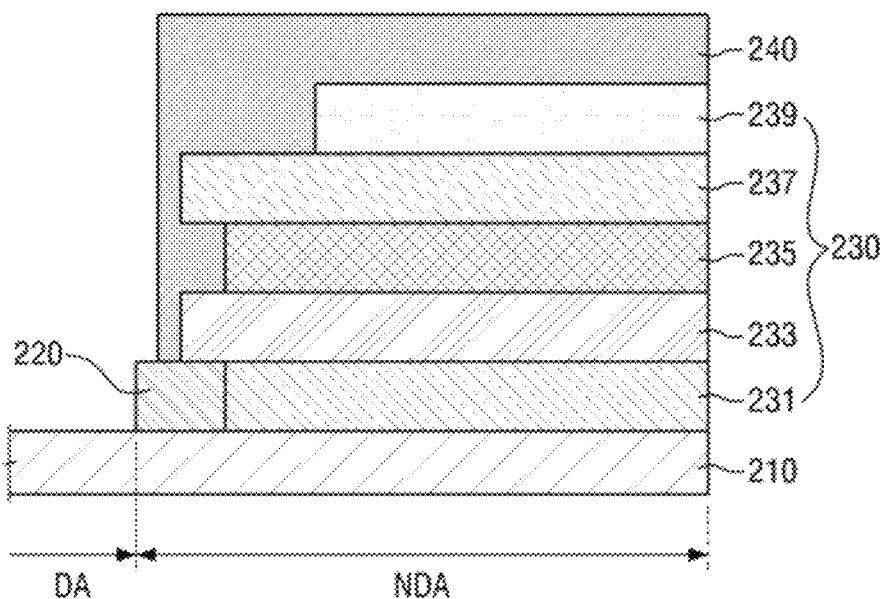
Figure 5:
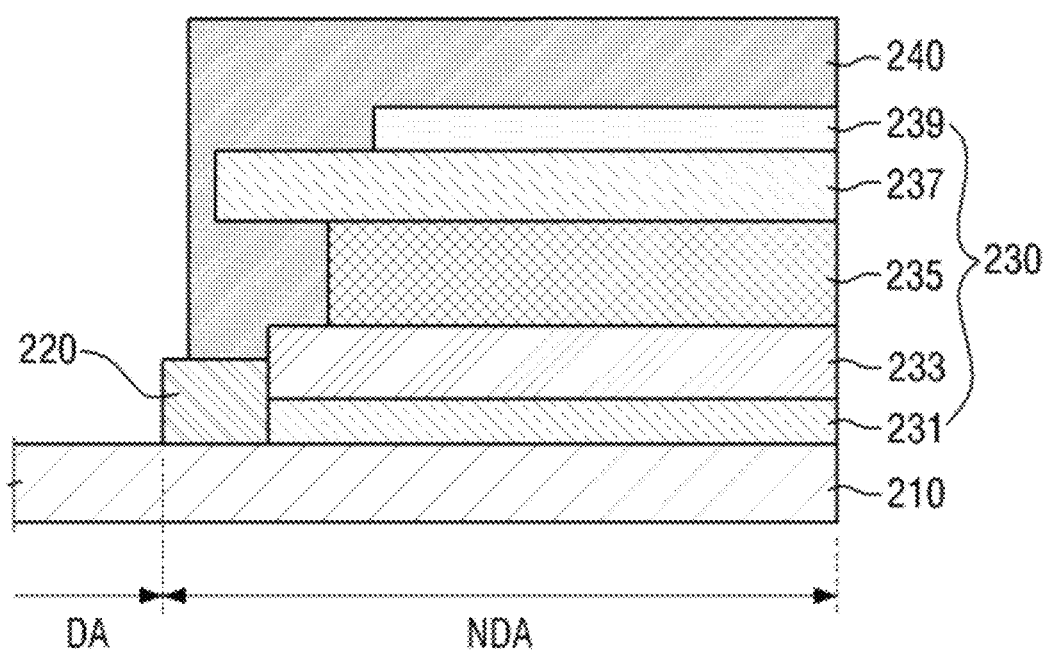
Figure 9:
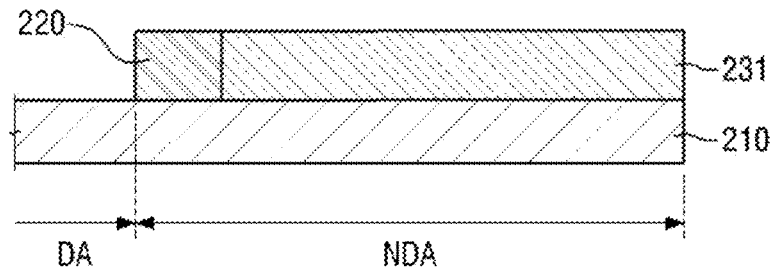
Figure 10:
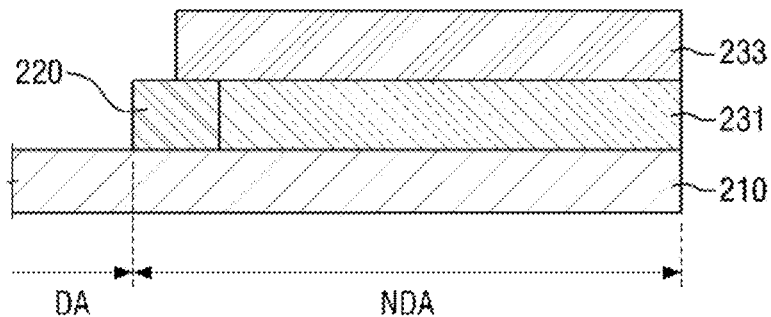
Figure 11:
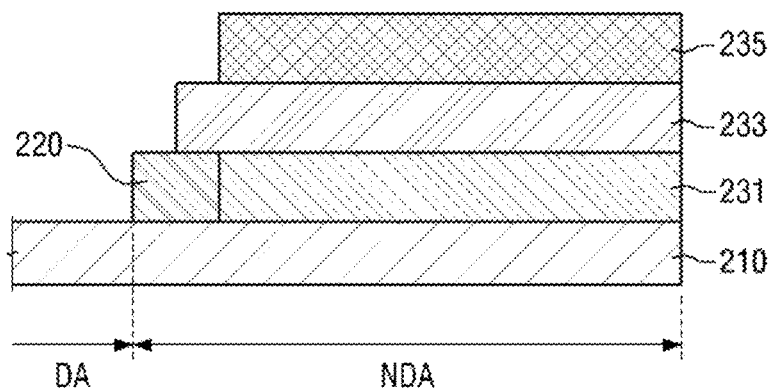
Figure 12:
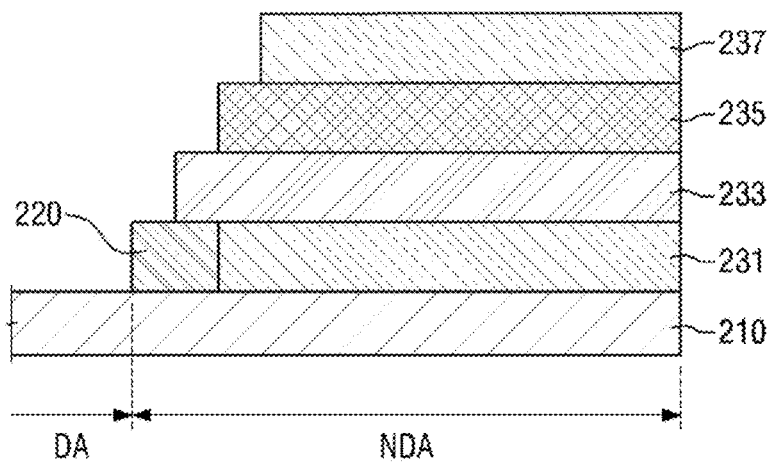
Figure 13:
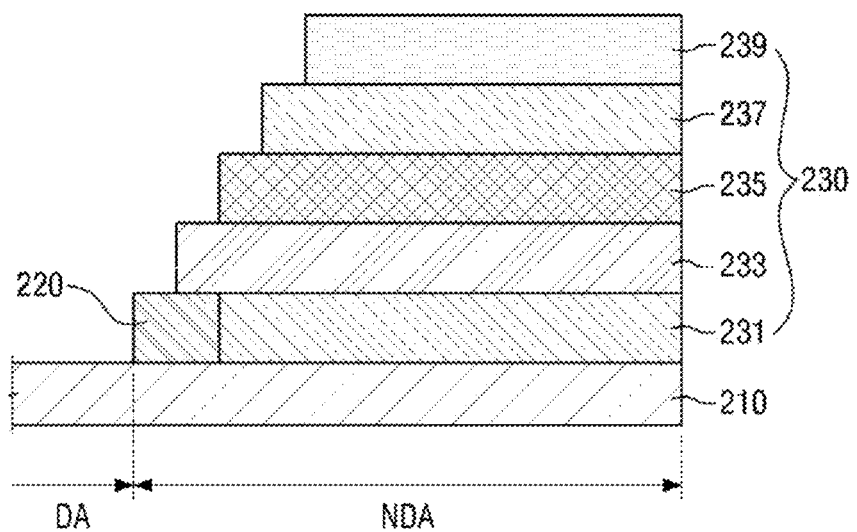

FIGS. 4 to 6 illustrate cross-sectional views of windows of display devices according to other exemplary embodiments.

In the exemplary embodiment of FIG. 4, a printed pattern 230 may not be formed to have a side aligned in a stepwise manner. Referring to a display device 10 of FIG. 4, a fourth printed layer 237 may be formed to be wider than a third printed layer 235, which may be formed below the fourth printed layer 237. In the exemplary embodiment of FIG. 4, like in the exemplary embodiment of FIG. 3, an inner side of the fourth printed layer 237, which may have a greatest width among other printed layers of the printed pattern 230, may be located nearer than an inner side of a bank layer 220 to an outer side of a window 201 for an effective display.

In the exemplary embodiment of FIG. 5, a plurality of printed layers of a printed pattern 230 may have different thicknesses from one another. For example, referring to FIG. 5, a first printed layer 231 may have a smaller thickness than a second printed layer 233. The first printed layer 231 also may have a smaller thickness than a bank layer 220. The second printed layer 233 may have a smaller thickness than a third printed layer 235. In the exemplary embodiment of FIG. 5, like in the exemplary embodiment of FIG. 3, an inner side of a fourth printed layer 237, which may have a greatest width among other printed layers of the printed pattern 230, may be located nearer than an inner side of the bank layer 220 to an outer side of a window 202 for an effective display.

A display device of FIG. 6 differs from a display device 10 of FIG. 5 in that air pockets 250 may be formed in a window 203. For example, the air pockets 250 may be formed in a shielding layer 240 and between the shielding layer 240 and a printed pattern 230. For example, each of the air pockets 250 may be air remaining in the window 203 during the formation of the shielding layer 240 or may be an empty space formed on the top surface or the bottom surface of each of a plurality of printed layers of a printed pattern 230, for example, due to differences in width between the printed layers of the printed pattern 230. Even though not specifically illustrated in FIG. 6, the air pockets 250 may also be formed between the shielding layer 240 and a bank layer 220. Each of the air pockets 250 may have a smooth surface, or an irregular surface.

In the exemplary embodiment of FIGS. 1 to 3, each of the first, second, third, fourth and fifth printed layers 231, 233, 235, 237, and 239 may be formed in various colors, for example, white, pearl, silver, and black, to apply a color to the bezel of the display device 10.

A method of manufacturing a display device, according to an exemplary embodiment will hereinafter be described.

FIG. 7 illustrates a flowchart of a method of manufacturing a display device, according to an exemplary embodiment, and FIGS. 8 through 14 illustrate cross-sectional views of processes of the method of manufacturing a display device, according to an exemplary embodiment.

Referring to FIGS. 7 and 8, a bank layer 220 may be formed on a transparent substrate 210 (S710).

The bank layer 220 may be formed on a surface of the transparent substrate 210 along the boundaries between a display area DA and a non-display area NDA, which may be predefined on the transparent substrate 210. The bank layer 220 may be formed in the shape of a band with a predetermined width and thickness. The bank layer 220 is illustrated in FIG. 8 as having a rectangular cross-sectional shape. In an embodiment, the bank layer 220 may be formed to have various other cross-sectional shapes, such as a circular, elliptical or polygonal cross-sectional shape.

Thereafter, as illustrated in FIG. 7, a printed pattern 230 may be formed on one side of the bank layer 220 (S720). The printed pattern 230 may be formed in the non-display area NDA of a window 200, and may be located relatively nearer than the bank layer 220 to an outer side of the window 200, i.e., closer to an outer side of the window 200 than is the bank layer 220.

The printed pattern 230 may be formed to more than a predetermined height to prevent light from leaking out of a display device 10 and to apply various colors to the bezel of the display device. For this, the printed pattern 230 may be implemented as a printed layer stack. For example, the printed pattern 230 may include a stack of a plurality of first, second, third, fourth and fifth printed layers 231, 233, 235, 237, and 239. The printed pattern 230 is illustrated in FIGS. 9 to 13 as including a stack of, for example, five printed layers.

Referring to FIGS. 9 to 13, the first printed layer 231 may be formed directly on the transparent substrate 210 and may contact an inner side of the bank layer 220 on one side thereof. In an embodiment, the first printed layer 231 may be formed to be a predetermined distance apart from the inner side of the bank layer 220, instead of being in contact with the inner side of the bank layer 220, depending on the design of the display device 10.

Thereafter, a second printed layer 233 may be formed directly on the first printed layer 231 and may contact the top surface of the bank layer 220 on one side thereof. Thereafter, a third printed layer 235 may be formed directly on the second printed layer 233, a fourth printed layer 237 may be formed directly on the third printed layer 235, and a fifth printed layer 239 may be formed directly on the fourth printed layer 237.

Five printed layers are illustrated in FIGS. 9 to 13 as being sequentially stacked. In an embodiment, fewer than, or more than, five printed layers, may be stacked to form the printed pattern 230.

Each of the first, second, third, fourth and fifth printed layers 231, 233, 235, 237, and 239 may be formed by various processes such as screen printing, lamination, or photolithography. In the description that follows, it is assumed that the first, second, third, fourth and fifth printed layers 231, 233, 235, 237, and 239 are formed by screen printing.

A process of forming a printed layer through screen printing may include operations of placing a screen mask with a predetermined opening on the transparent substrate 210, applying ink of a predetermined color onto the screen mask with the use of a squeegee, and removing the screen mask.

In the method of manufacturing a display device, according to an exemplary embodiment, the process of forming a printed layer may include curing the ink applied onto the transparent substrate 210. The ink applied onto the transparent substrate 210 may be cured, for example, by infrared (IR) curing or hot air curing. In an embodiment, the ink applied onto the transparent substrate 210 may be cured by various other curing methods.

An opening may be formed in the screen mask, conforming to the shape of a printed layer to be formed. For an effective filling of ink in the opening of the screen mask, a mesh may be formed in the opening.

The ink of the predetermined color may be applied to the screen mask by rolling the ink of the predetermined color onto the screen mask at a predetermined speed with a squeegee tilted at a predetermined angle, and the opening of the screen mask may be filled with the ink of the predetermined color.

The screen mask may be removed by lifting off the screen mask in a direction perpendicular to the transparent substrate 210.

During the removal of the screen mask, ink may splatter to the surroundings, for example, due to its surface extension, but the ink splatter may be blocked from spreading by the bank layer 220, which may be formed before the formation of a printed layer, and a printing error may be prevented. For example, ink splatter automatically may fall on the top surface of the bank layer 220, and may not be able to be visible from the front of the display device 10.

Since the bank layer 220 may serve as a dam for preventing ink from spreading to the surroundings and even if there is a spread of ink, the ink may spread only to the top surface of the bank layer 220, and no ink spread may be visible from the front of the display device 10.

In S710, the thickness and width of the bank layer 220 may be determined in consideration of the viscosity of ink to be used so as for the bank layer 220 to effectively prevent color defects that may be caused by a splatter or spread of ink.

The thickness and width of the bank layer 220 may be varied depending on the viscosity of ink to be used.

For example, the thickness and width of the bank layer 220 may be appropriately determined in consideration that the higher the viscosity of ink, the less likely the ink is to splatter and even if there is an ink splatter, the distance travelled by the ink splatter may be relatively short.

The thickness and width of the bank layer 220 may also be appropriately determined in consideration that the lower the viscosity of ink, the more likely the ink is to splatter and if there is an ink splatter, the distance travelled by the ink splatter may be relatively long.

In an embodiment, in S710, the thickness and width of the bank layer 220 may be determined in consideration of the thickness of a printed layer pattern to be formed so as for the bank layer 220 to effectively prevent color defects that may be caused by a splatter or spread of ink.

The thickness and width of the bank layer 220 may be varied depending on the thickness of a printed layer pattern to be formed.

For example, the thickness and width of the bank layer 220 may be appropriately determined in consideration that thinner the printed layer to be formed, the less likely the ink is to splatter during the removal of the screen mask, and even if there is an ink splatter, the distance travelled by the ink splatter may be relatively short.

The thickness and width of the bank layer 220 may also be appropriately determined in consideration that the thicker the printed layer to be formed, the more likely the ink is to splatter during the removal of the screen mask, and if there is an ink splatter, the distance travelled by the ink splatter may be relatively long.

The aforementioned operations of placing the screen mask with a predetermined opening on the transparent substrate 210, applying ink of a predetermined color onto the screen mask with the use of a squeegee, and removing the screen mask may be sequentially performed, and an individual printed layer may be formed. By repeatedly performing the operations of placing the screen mask with a predetermined opening on the transparent substrate 210, applying ink of a predetermined color onto the screen mask with the use of a squeegee, and removing the screen mask, a stack of the first, second, third, fourth and fifth printed layers 231, 233, 235, 237, and 239 may be formed.

The method of manufacturing a display device, according to an exemplary embodiment may include curing the first, second, third, fourth and fifth printed layers 231, 233, 235, 237, and 239. Each of the first, second, third, fourth and fifth printed layers 231, 233, 235, 237, and 239 may be formed and then cured. In an embodiment, the first, second, third, fourth and fifth printed layers 231, 233, 235, 237, and 239 may all be formed first, and then the curing of the first, second, third, fourth and fifth printed layers 231, 233, 235, 237, and 239 may be performed. In an embodiment, the first, second, third, fourth and fifth printed layers 231, 233, 235, 237, and 239 may be selectively cured during their formation in consideration of their thickness and viscosity.

Figure 14:
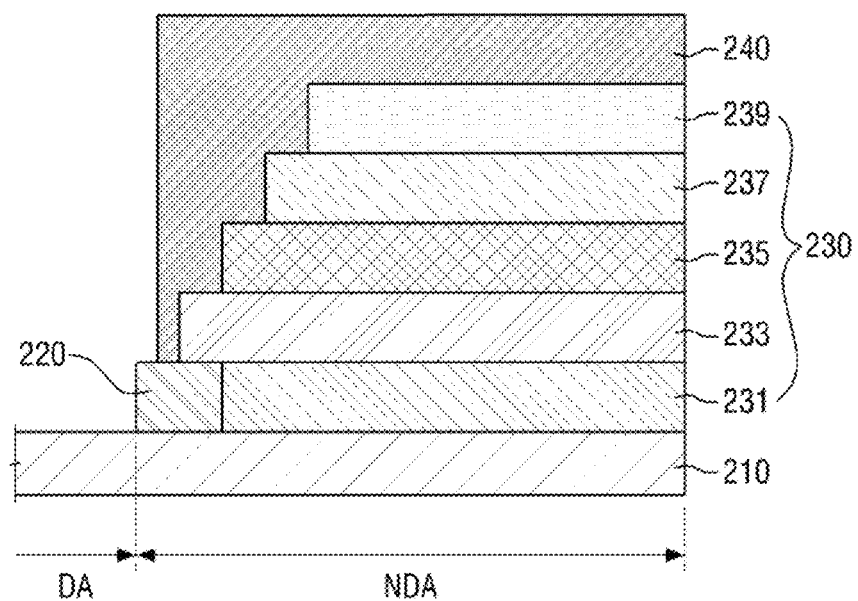

Thereafter, referring to FIGS. 7 and 14, a shielding layer 240 for shielding the printed pattern 230 may be formed (S730). The shielding layer 240 may be formed to contact the top surface of the bank layer 220. For an effective display, the shielding layer 240 may be formed such that an inner side of the bank layer 220 may be located nearer than an inner side of the bank layer 220 to the outer side of the window 200. The shielding layer 240 may prevent the printed pattern 230, which may be formed to more than the predetermined height, from being exposed to the outside of the window 200. The shielding layer 240 may be formed in a dark color such as black in order to effectively prevent the printed pattern 230 from being visible from the outside of the window 200.

Thereafter, as illustrated in FIG. 7, the transparent substrate 210 where the bank layer 220, the printed pattern 230 and the shielding layer 240 are formed may be bonded to the display panel 100 (S740).

The transparent substrate 210 may be bonded to the display panel 100 in such a manner that the surface of the transparent substrate 210 where the bank layer 220, the printed pattern 230 and the shielding layer 240 are formed may face a light-emitting direction of the display panel 100. The transparent substrate 210 and the display panel 100 may be bonded together by a bonding layer 300, which may be interposed between the window 200 and the display panel 100.

By way of summation and review, in a screen printing method, an opening of a screen mask may be filled with ink by moving a squeegee onto a substrate, the screen mask may be removed, and an ink pattern may be printed on the substrate.

During removal of the screen mask, ink may splatter or bleed to the surroundings, for example, due to its surface tension, and ink may be printed on parts other than particular designated areas, i.e., color defects may be produced. When screen printing is performed by using the display window of a smartphone as a substrate, any splatter or spread of ink may be visible from the front of the smartphone, and may make the appearance of the smartphone unfavorable.

Exemplary embodiments may provide a display device capable of effectively preventing color defects from being produced during the formation of a printed pattern of a window by using a bank layer, and a method of manufacturing the display device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a display panel; and
a window facing the display panel,
a display area and a non-display area, which is around the display area, being on the window and the window including a transparent window substrate, which has a first surface facing the display panel and a second surface opposite to the first surface, a bank layer, which is on the first surface of the transparent window substrate along boundaries between the display area and the non-display area, a printed pattern, which includes a plurality of printed layers, is in the non-display area of the transparent window substrate, and is located closer to an outer side of the window than is the bank layer, and a shielding layer that covers the printed pattern,
wherein:
the printed layers include a first printed layer on the transparent window substrate and at least one other printed layer on the first printed layer such that the first printed layer is between the transparent window substrate and the at least one other printed layer,
the at least one other printed layer has a width that is greater than a width of the first printed layer,
the shielding layer directly contacts a top surface of the bank layer,
the at least one other printed layer includes a first bottom surface facing the bank layer and a second bottom surface facing the first printed layer, and the first bottom surface is coplanar with the second bottom surface, and
an inner side of the shielding layer is located closer to the outer side of the window than an inner side of the bank layer.

2. The display device as claimed in claim 1, wherein the bank layer is in the shape of a band.

3. The display device as claimed in claim 1, wherein each of the printed layers is located closer to the outer side of the window than is an inner side of the bank layer.

4. The display device as claimed in claim 1, wherein one of the printed layers has a first thickness and another of the printed layers has a second thickness.

5. The display device as claimed in claim 1, wherein the first printed layer contacts an inner side of the bank layer on one side thereof.

6. The display device as claimed in claim 1, wherein the printed layers include a printed layer with a first color and a printed layer with a second color.

7. The display device as claimed in claim 1, wherein the shielding layer includes air pockets between the shielding layer and the printed pattern or between the shielding layer and the bank layer.

8. The display device as claimed in claim 1, further comprising a bonding layer bonding the display panel and the window together.

9. A method of manufacturing a display device, the method comprising:
forming a bank layer on a first surface of a transparent window substrate along boundaries between a display area and a non-display area, which are predefined on the transparent window substrate;
forming a printed pattern on the first surface of the transparent window substrate such that the printed pattern is located closer to an outer side of the transparent window substrate than is the bank layer;
forming a shielding layer on the printed pattern for shielding the printed pattern; and
bonding the transparent window substrate and a display panel such that the first surface of the transparent window substrate faces the display panel,
wherein forming the printed pattern includes forming a plurality of printed layers by repeatedly placing a screen mask on the transparent window substrate, applying ink onto the screen mask, and removing the screen mask such that:
the printed layers include a first printed layer directly on the transparent window substrate and at least one other printed layer on the first printed layer such that the first printed layer is between the transparent window substrate and the at least one other printed layer, and
the at least one other printed layer has a width that is greater than a width of the first printed layer,
wherein:

the shielding layer directly contacts a top surface of the bank layer, an inner side of the shielding layer is located closer to the outer side of the window than an inner side of the bank layer, and the at least one other printed layer includes a first bottom surface facing the bank layer and a second bottom surface facing the first printed layer, and the first bottom surface is coplanar with the second bottom surface.

10. The method as claimed in claim 9, wherein forming the bank layer includes forming the bank layer in the shape of a band.

11. The method as claimed in claim 9, wherein forming the printed pattern further includes curing the ink applied onto the transparent window substrate.

12. The method as claimed in claim 9, further comprising forming a shielding layer for shielding the printed pattern.

* * * * *